(12) United States Patent
Yashiro

(10) Patent No.: US 6,724,004 B2
(45) Date of Patent: Apr. 20, 2004

(54) METHOD AND APPARATUS FOR ELIMINATION OF HIGH ENERGY ION FROM EUV RADIATING DEVICE

(75) Inventor: Hidehiko Yashiro, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/279,854

(22) Filed: Oct. 25, 2002

(65) Prior Publication Data

US 2003/0080302 A1 May 1, 2003

(30) Foreign Application Priority Data

Oct. 25, 2001 (JP) ......................................... 2001-327783

(51) Int. Cl.$^7$ ................................................. G01J 1/00
(52) U.S. Cl. ............................. 250/504 R; 250/492.1; 250/491.1; 378/34; 378/35; 378/119
(58) Field of Search ........................... 250/492.1, 491.1, 250/504; 378/119, 34, 35

(56) References Cited

U.S. PATENT DOCUMENTS 6,064,072 A * 5/2000 Partlo et al. ............. 250/504 R

FOREIGN PATENT DOCUMENTS

JP          9-320792          12/1997

* cited by examiner

*Primary Examiner*—John R. Lee
*Assistant Examiner*—David A. Vanure
(74) *Attorney, Agent, or Firm*—Oblon, Spivak, McClelland, Maier & Neustadt, P.C.

(57) ABSTRACT

A method for the elimination of high-energy ion in an EUV light-radiating device includes irradiating a first target with a first exciting laser to produce a laser-produced plasma EUV light source and causing a high-energy ion generated simultaneously with EUV light to collide against plasma produced by irradiating a second target with a second laser to separate the high-energy ion from the orbit of the EUV light. An apparatus for the elimination of a high-energy ion in an EUV light-radiating device includes a device for irradiating a first target with a first exciting laser to produce a plasma EUV light source and induce emission of EUV light, a device for irradiating a second target with a second laser to produce plasma, and a device for causing a high-energy ion generated simultaneously with the EUV light to be delayed by difference between an ion flight time and plasma expansion time for ion elimination and collide against the plasma to separate the high-energy ion from the orbit of the EUV light.

16 Claims, 4 Drawing Sheets

METHOD AND APPARATUS FOR ELIMINATION OF HIGH ENERGY ION FROM EUV RADIATING DEVICE

BACKGROUND OF THE INVENTION

1. Field of the Invention

This invention relates to a method and an apparatus for eliminating the high-energy ion that is ejected simultaneously with extremely ultraviolet light (hereinafter abbreviated as "EUV light") from an EUV light-radiating.

2. Description of the Prior Art

The plasma light source has outstanding characteristics, such as small size, high brilliance, high repetitional operation and ability to radiate short wavelengths emission even reaching the hard X ray. However, the high-energy ion is inevitably emitted simultaneously with the EUV light from the plasma light source and the vicinity thereof in consequence of the formation of plasma, and the maximum speed thereof reaches $10^6$ to $10^7$ cm/s. The high-energy ion inflicts fracture and injury on a multilayer mirror as by spattering and ion implantation and consequently induces it to suffer from deterioration of performance. Further, in the case of an analytical device using EUV light, the admission of this ion possibly results in varying the composition of a given specimen during the operation of the device.

For the purpose of eliminating this high-energy ion, methods directed toward allaying this ion by the collision thereof against an object, such as a gas or a filter, have been heretofore proposed. In the "X-ray generating apparatus" disclosed in JP-A HEI 09-320792, for example, scattered particles including the high-energy ion are caused to collide against a gas that has a low X-ray (EUV) absorption factor, thereby eliminating the dispersed particles. Since the gas used for the elimination herein is interposed between the light source and an object for irradiation with the EUV light, the intensity of radiation used in the apparatus is lowered because the gas inevitably absorbs the EUV light as well. A method that contemplates shuttering the high-energy ion by spouting the gas at a high speed in the form of a jet has been proposed. This shutter, however, is incapable of acquiring such a high speed as suffices the expected function because the ratio of expansion of the ion emitted from the plasma differs by more than several decimal places from that of the gas.

As means to eliminate the high-energy ion in the EUV light source, the method which consists in interposing a gas or a filter having a low EUV light absorption factor between the EUV light source and the optical system operating with EUV light has been known to the art as described above. Though this method indeed accomplishes the elimination of the ion as expected, it is fated to entail additional absorption of the EUV light. For the purpose of increasing the quantity of this ion to be eliminated, the object against which the ion is made to collide is required to have the thickness thereof increased and assume a state of high compaction and is consequently suffered to entail an addition to the absorption of EUV light and a remarkable decline in the intensity of EUV light.

None of the known methods which have invariably relied on the collision of the high-energy ion against an object, such as a gas or a filter, to effect the elimination of high-energy ion is capable of effectively eliminating the ion exclusively with no sacrifice of the performance of the EUV light.

This invention has for an object thereof the provision of a method and an apparatus for the elimination of the ion in an EUV light-radiating device, which are capable of effectively eliminating the high-energy ion exclusively without a sacrifice of the intensity of the EUV light.

SUMMARY OF THE INVENTION

The method contemplated by this invention for the elimination of a high-energy ion in an EUV light-radiating device comprises irradiating a target with an exciting laser to form a laser-produced plasma EUV light source and causing a high-energy ion generated simultaneously with EUV light to collide against plasma formed by irradiating another target with another laser to separate the high-energy ion exclusively from an orbit of the EUV light.

The apparatus contemplated by this invention for the elimination of a high energy ion in an EUV light-radiating device comprises means for irradiating a target with an exciting laser to form a plasma EUV light source and induce emission of EUV light from the EUV light source, means for irradiating another target with another laser to form plasma for ion elimination, and means for causing a high-energy ion generated simultaneously with the EUV light to collide against the plasma for ion elimination to separate the high-energy ion exclusively from an orbit of the EUV light. For this reason, the plasma for ion elimination has to be formed, with the difference between ion flight time and plasma expansion delayed.

The plasma EUV light source is laser-produced plasma, pinch plasma, or discharge plasma entrapped in a capillary tube. The plasma for the elimination of the high-energy ion embraces plasma that is intended for the formation of a laser.

The collision of the high-energy ion from the EUV light source against the plasma for ion elimination embraces a process of initially allowing passage of the EUV light and subsequently causing the high-energy ion entrained consequently by the EUV light to collide against the plasma.

The target for the formation of the laser-produced plasma EUV light source is formed of B, C, Al, Cu, Xe or Sn, or a compound using any one of the elements as a principal component. The target for the formation of the plasma for the elimination of the ion is formed of Si, Ar, Zn, Ga, Kr, Mo, In, Sn, Xe, Pb or Hg, or a compound using any one of the elements as a principal component.

The laser that forms plasma for ion elimination embraces forming column of plasma for ion elimination by focusing the laser at discrete column on a target or for forming planar plasma for ion elimination by focusing the laser linearly on a target. Plasma expansion forms column shape in the case of spot focusing. Planar plasma is also defined by the linearly longitudinal direction and the plasma blow-off direction. Plasma for ion elimination disposed so that the high-energy ion collides between the light source and the EUV-irradiated medium or EUV mirror.

The surface of the target to be irradiated with the laser to produce the plasma for ion elimination embraces inclining the surface at a predetermined angle so as to prevent the ejected particles issuing from the plasma from impinging at a solid angle on the object irradiated with the EUV light.

It further embraces interposing a plate between the plasma for ion elimination and the object irradiated with the EUV light so as to prevent the ion originating in the plasma from impinging at a solid angle on the object irradiated with the EUV light.

According to this invention, it is made possible by causing the high-energy ion emitted from a plasma EUV light source simultaneously with EUV light to collide against plasma produced by another laser to realize a high-speed shutter with absolutely no loss of the intensity of the EUV light. It is made possible as well by utilizing the collision for separating the orbit of the high-energy ion from the EUV light to materialize long-time exposure to the EUV light without entailing any change of composition by the high-energy ion in a minute specimen used for the irradiation with the EUV light. Since the speed of the low-energy ions and microparticles from EUV light is slow, scattered particles other than the high-energy ion can also be eliminated when using a mechanical shutter in combination with the high-speed shutter.

Furthermore, by combining this invention with partition walls so constructed as to preclude diminution of the solid angle from the EUV light source, it is made possible to effect the elimination of the high-energy ion from the plasma EUV light source even during the collection of the EUV light at a large solid angle.

The other objects and characteristics of this invention will become apparent more specifically from the following description based on the accompanying drawing.

DESCRIPTION OF THE PREFERRED EMBODIMENT

Figure 1:
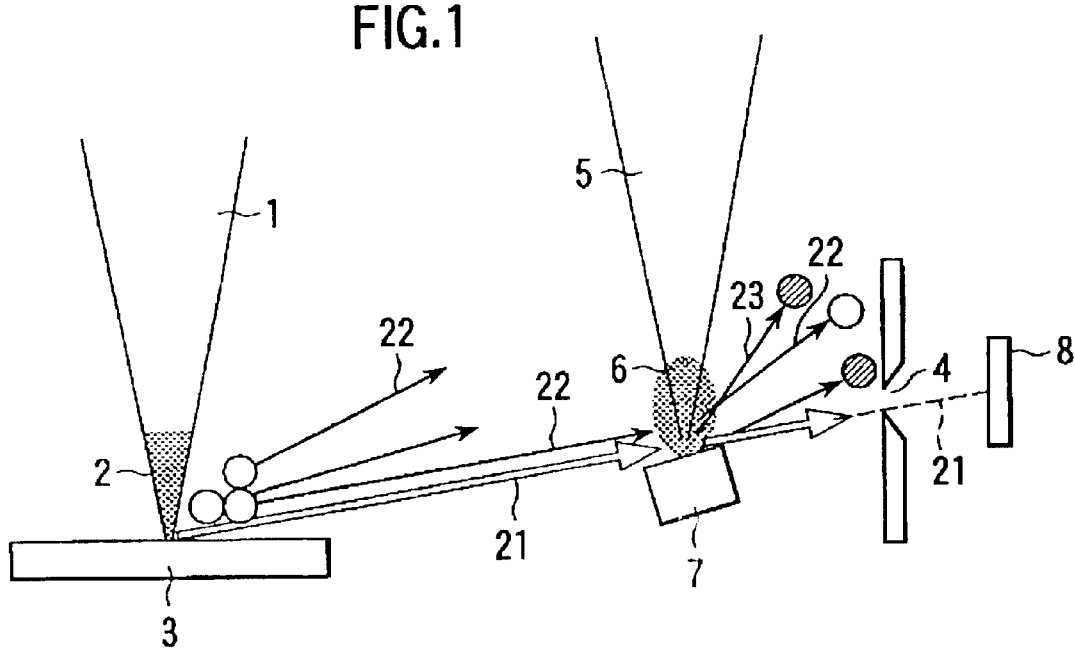
FIG. 1 is an explanatory diagram of a method contemplated by this invention for the elimination of ion in a minimal area EUV light-radiating device.

This invention is directed toward the elimination of scattered particles in an EUV light-radiating device, which comprises irradiating a target with an exciting laser to produce a laser-produced plasma EUV light source and causing a high-energy ion emitted from the EUV light source in conjunction with EUV light to collide against plasma formed by irradiating another target with another laser to separate the high-energy ion from the orbit of the EUV light.

The plasma EUV light source is laser-produced plasma, pinch plasma or discharge plasma entrapped in a capillary tube. As the exciting laser, a high-power laser that is capable of exhibiting high repeatability of operation is used. As concrete examples of the laser of this description, the. YAG laser (inclusive of the second and the third harmonics), the KrF laser and the Ti sapphire laser may be cited. The pulse width is 3 to 20 ns in the case of the YAG laser, several to several tens of ns in the case of the KrF laser, and not more than 1 ps or a pulse-incompressible width of several hundreds of ps in the case of the Ti sapphire laser. The pulse interval of each of the lasers is in the range from several tens of kHz as the maximum to the order of 10 Hz with due respect to the high repeatability of operation. The minimum interval, therefore, is several tens of $\mu$s.

As an optical device to reflect the EUV light from the laser-produced plasma, a Mo/Si multilayer mirror exhibiting high reflectivity as an EUV optics can be cited. As concrete examples of the target for irradiation with the EUV light, Xe, and Sn which, when used in the multilayer mirror, radiate a wavelength suitable for the multilayer mirror can be cited. It is also permissible to use B, C, Al or Cu that permits manufacture of a Mo/Si multilayer mirror and allows the presence of a spectral line of a large transition probability in a wavelength range capable of obtaining large reflectivity. A compound containing any one of the aforementioned elements as a principal component may be used The Xe gas or gas containing Sn microparticles or Sn compounds is used for the EUV light source in the pinch plasma or discharge plasma.

As the target for irradiation with the plasma intended for the elimination of ion, Ar, Zn, Ga, Kr, Mo, In, Sn, Xe, Pb or Hg besides Si, or a compound containing any one of the elements as a principal component thereof may be used In the case of an EUV light-radiating device having a large solid angle area, the Mo/Si multilayer mirror is a candidate because of its high reflectivity. In this case, though the device possibly suffers scattered particles of low energy to adhere to the target for the elimination of ion, by alternately using Si and Mo as the target for irradiation with the plasma intended for elimination of the high-energy ion to deposit them on the multilayer mirror, no problem is practically posed.

Inert gases, such as He, Ne, Ar, Kr and Xe are highly promising candidates for the target in respect that they readily gasify and do not form a compound. Since the plasma allows no satisfactorily effective control unless it has a high density, however, the target to be used for irradiation with the plasma for controlling the high-energy ion is preferred to be in a liquefied or solidified state. Particularly, with a light element, it is difficult to cause a change in the orbit of a heavy ion, such as Sn or Xe, which is in a fright at a high speed. In this connection, Kr, Xe and the like prove preferable.

Since Sn and Xe are promising candidates for the target to be irradiated with the plasma EUV light, the target for irradiation with the plasma intended for elimination of the high-energy ion allows easy control when it is made of such a substance.

Further, low melting substances, such as In, Hg, Ga and Pb can be used with the aim of effecting the elimination of the low-energy ion and particles coated on a multilayer mirror in a liquefied state. Then, a substance, such as Zn, which has a low boiling point and a high vapor pressure and therefore allows easy exfoliation proves advantageous for the purpose of effecting the elimination of the ion and particles coated on a mirror in a gasified state.

Now, this invention will be further described below with reference to the accompanying drawings.

The EUV light-radiating device is known in two types, i.e. the EUV light-radiating device that is adapted to irradiate a minimal area and the EUV light-radiating device that is adapted to irradiate a large solid angle area.

FIG. 1 depicts a minimal area EUV light-radiating device in a state engaging in the elimination of high-energy ion by irradiating a target 3 with an exciting pulse laser beam 1 to produce a plasma EUV light source 2. EUV light 21 issuing from the plasma light source 2 is passed through an irradiation area-setting window 4 and then allowed to irradiate a specimen 8.

A target 7 for the formation of plasma used in the elimination of ion is disposed in the light path for the EUV light that intervenes between the target 3 and the irradiation area-setting window 4. An exciting laser beam 5 is made to irradiate the target 7 so as to produce plasma 6.

As a result, the plasma 6 collides against a high-energy ion 22 that is generated simultaneously with the EUV light 21 in the plasma EUV light source 2 and separates itself from the orbit of the EUV light. Thus, the plasma 6 is no longer capable of advancing through the area-setting window 4 and eventually fracturing the specimen 8.

Figure 2:
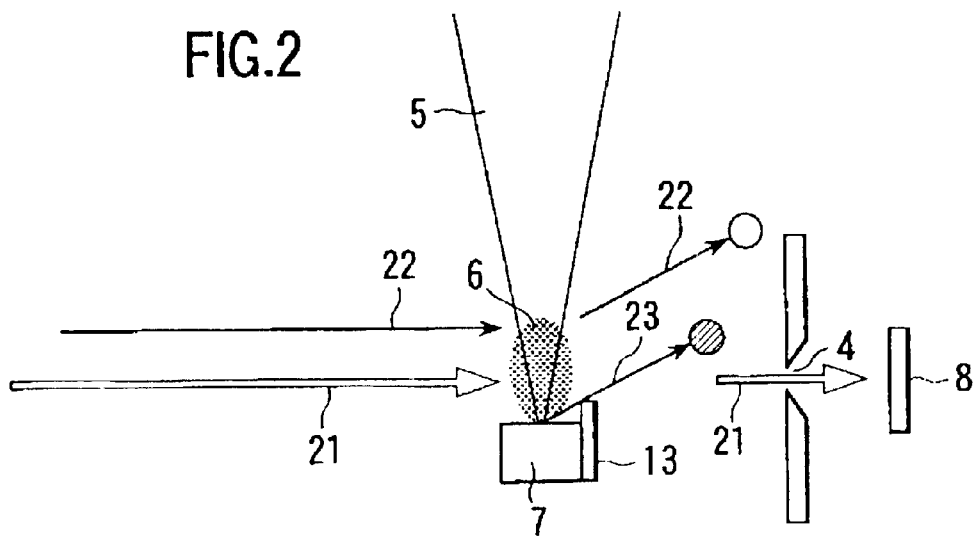
FIG. 2 is an explanatory diagram of a method contemplated by this invention for the elimination of ion in a minimal area EUV light-radiating device.

At this time, by inclining the target 7 at a predetermined angle for preventing geometrically the point of irradiation of the laser beam 5 on the target 7 for the formation of the plasma 6 from being seen through the irradiation area-setting window 4, it is made possible to obstruct scattered particles 23 originating in the plasma 6 for the elimination of ion from directly reaching the specimen 8. As shown in FIG. 2, a provision of the plate 13 at the tip of the target 7 instead of inclining the target 7 causes high-energy ion that generated by the laser beams 5 irradiated at the target 7 to collide the plate 13, thereby preventing the high-energy ion from entering the window 4.

The high-energy ion issuing from the plasma EUV light source 2, such as the laser-produced plasma, pinch plasma or discharge plasma entrapped in a capillary tube, which is formed by irradiating the target 3 with the laser beam 1 can be effectively eliminated by selecting the laser-produced plasma itself as a substance against which the high-energy ion is made to collide. The high-energy ion from the plasma EUV light source and expansion of the plasma for elimination are nearly equal speeds. The EUV light from the laser-produced plasma for use in the elimination of ion, therefore, functions as a high-speed shutter. Further, since the EUV light has a very short pulse width substantially the same as the irradiated laser pulse width and a speed higher by not less than three decimal places than the ion, it completely permeates the specimen before the high-speed shutter is put to operation and incurs absolutely no attenuation.

In this invention, of all the scattered particles the high-energy ion that poses the most serious problem can be eliminated by the collision with another plasma at absolutely no sacrifice of the intensity of the EUV light issuing from the plasma EUV light source as described above. It is, therefore, made possible to realize the elongation of the service life of the EUV optical mirror advantageously decrease the cost spent for the EUV optical mirror which is expensive, and reduce the number of complicated optical settings required for the EUV optical system in the EUV light source In the analytical device using the EUV light, this invention can realize such a mechanism as renders the change of composition caused by the high-energy ion generated in consequence of a protracted irradiation with the EUV light totally negligible.

In an experiment having a plasma EUV light source and a plasma for the elimination of ion was demonstrated. Plasmas were disposed as separated from each other by a distance of about 60 mm and a ion detector disposed at a position separated from a specimen by a distance of 160 mm. YAG lasers were used for plasma production as the excitation of EUV light and the plasma for elimination of ion. Al slabs were used as a target for the plasma EUV light source and for the plasma intended for the elimination of ion. The ions issuing from the EUV light source plasma could be repressed approximately to less than several %, which is electrical noise level. In proportion as the position of the plasma for the elimination of ion was moved to an increasingly greater distance and the plasma was made to collide against the ion across a proportionately increased interval, the effect of this collision tended to weaken slightly. Within a distance up to 10 mm, however, the effect of the ion could be attenuated fully satisfactorily.

Now, the state of elimination of high-energy ions in an EUV light-radiating device adapted to irradiate a large solid angle area will be described below with reference to FIG. 3.

Figure 3:
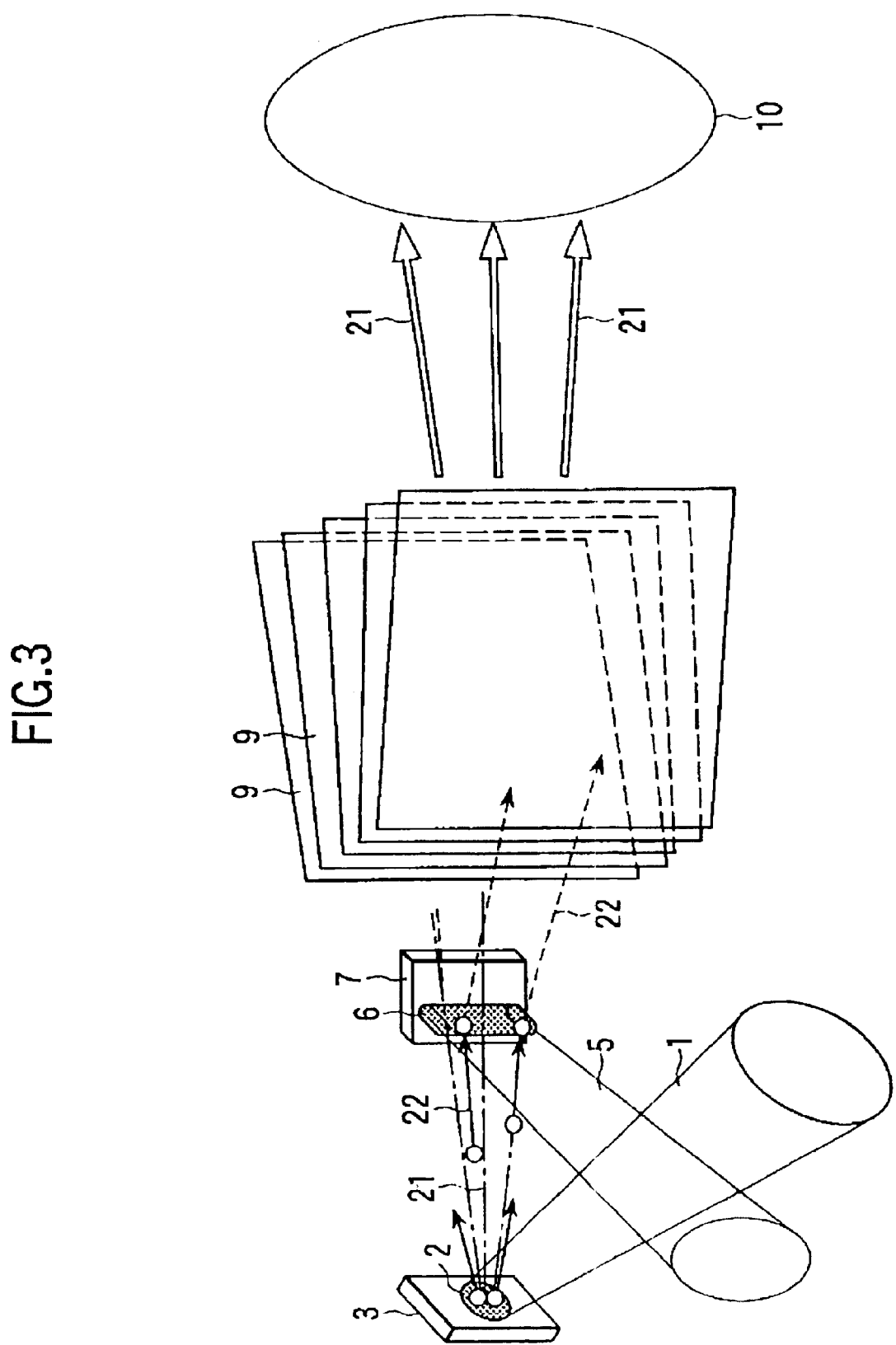
FIG. 3 is an explanatory diagram of a method contemplated by this invention for the elimination of ion in a large solid angle area EUV light-radiating device.

As depicted in FIG. 3, the pulse laser beam 1 for the formation of EUV light was made to irradiate the target 3 for the EUV light source to produce the EUV light source 2. In the space between the plasma EUV light source 2 of the target 3 and an optical mirror 10, a plurality of partitioning walls 9 are disposed at predetermined intervals. In the orbit of the EUV light 21 issuing from the plasma EUV light source 2, the target 7 for the formation of the plasma 6 intended for the elimination of ion is disposed.

The EUV light 21 emanating from the plasma EUV light source 2 is advanced through the gap between the adjacent partitioning walls 9 till the EUV optical mirror 10 and then reflected by the mirror 10. In this case, the laser beams 5 issuing from the pulse laser for the formation of the plasma intended for the elimination of ion are linearly condensed with a cylindrical lens (not shown) and are used for irradiating the target 7 for the plasma intended for the elimination of ion. The plasma 6, by expanding itself around the direction of the normal of the target 7, is enabled to function as the plasma 6 for the elimination of ion in a plane that includes the linear longitudinal direction and the direction of expansion.

In other words, when the EUV light radiated in a large solid angle is reflected on the EUV optical mirror 10 in a method for producing the plasma EUV light source 2 by irradiating the target 3 with a pulse laser 1 as illustrated in FIG. 3, the EUV light 21 radiated from the EUV light source 2 passes between the adjacent partitioning walls 9 formed in a plane radially extended from the position at which the plasma is present, irradiates on the EUV optical mirror 10, and then reflects itself on the mirror 10. The construction embodying this method, therefore, is capable of capturing the EUV light wholly, namely at 100 percent, when the wall thickness is not taken into consideration. Further, the construction is such that the ion 22 whose orbit has been bent by the plasma 6 is either made to collide against the partitioning walls 9 and consequently captured or repelled and consequently made to collide against another wall. Therefore, the multilayer optical mirror will not be directly damaged in a high-energy state. It is such a plurality of plate-shaped partitioning walls 9 disposed at the predetermined intervals as illustrated in FIG. 3 that basically conform to the construction under discussion.

The high-energy ion emitted from the plasma light source 2 simultaneously with the EUV light is released in all directions as illustrated in FIG. 3. For the purpose of enabling the thus released ion to be eliminated in a large solid angle, the laser beams 5 for the elimination of ion are linearly condensed so as to irradiate the target 7. Since the plasma 6 formed in the target 7 is mainly expanded in the direction of the normal of the target, it is formed in the shape of a plane that includes the axis in a linear direction and the axis in the direction of expansion of the plasma. Thus, the plasma formed as expanded in the shape of the plane is preferred to be perpendicular to the line connecting the centers of the EUV light source 6 and EUV optical mirror 10 and perpendicular to the central partitioning wall.

In the construction which is consequently obtained, the ion which has collided against the plasma 6 is advanced in an orbit different from the orbit of radiation of the EUV light, caused to collide several times against the partitioning walls disposed in front of the BIN optical mirror, and eventually deposited on or injected into the partitioning walls 9. As a result, the high-energy ion will neither reach the EUV optical mirror directly nor fracture or damage the EUV optical mirror.

As means for preventing the high-energy ion 22 from reaching the optical mirror 10, the plural plate-shaped partitioning walls 9 are cited as shown in FIG. 3. However, a bundle of plural cones 11 shown in FIG. 4 may be used instead. It is noted that the same effects can be obtained in the case of a bundle of a plurality of triangular, tetragonal, hexagonal or resemble shapes pyramids.

Figure 4:
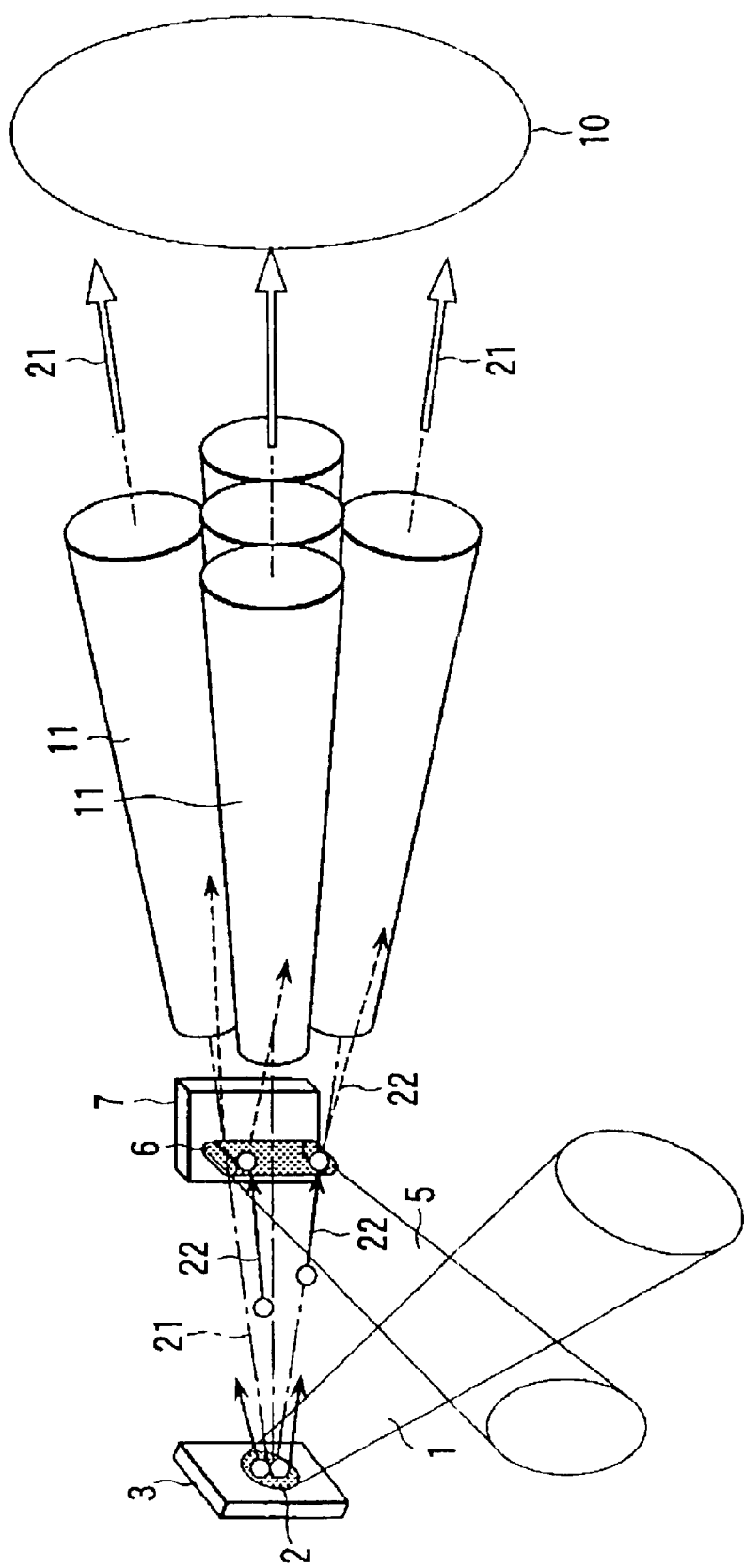
FIG. 4 is an explanatory diagram of another embodiment of the method contemplated by this invention for the elimination of ion in the large solid angle area EUV light-radiating device.
Figure 5:
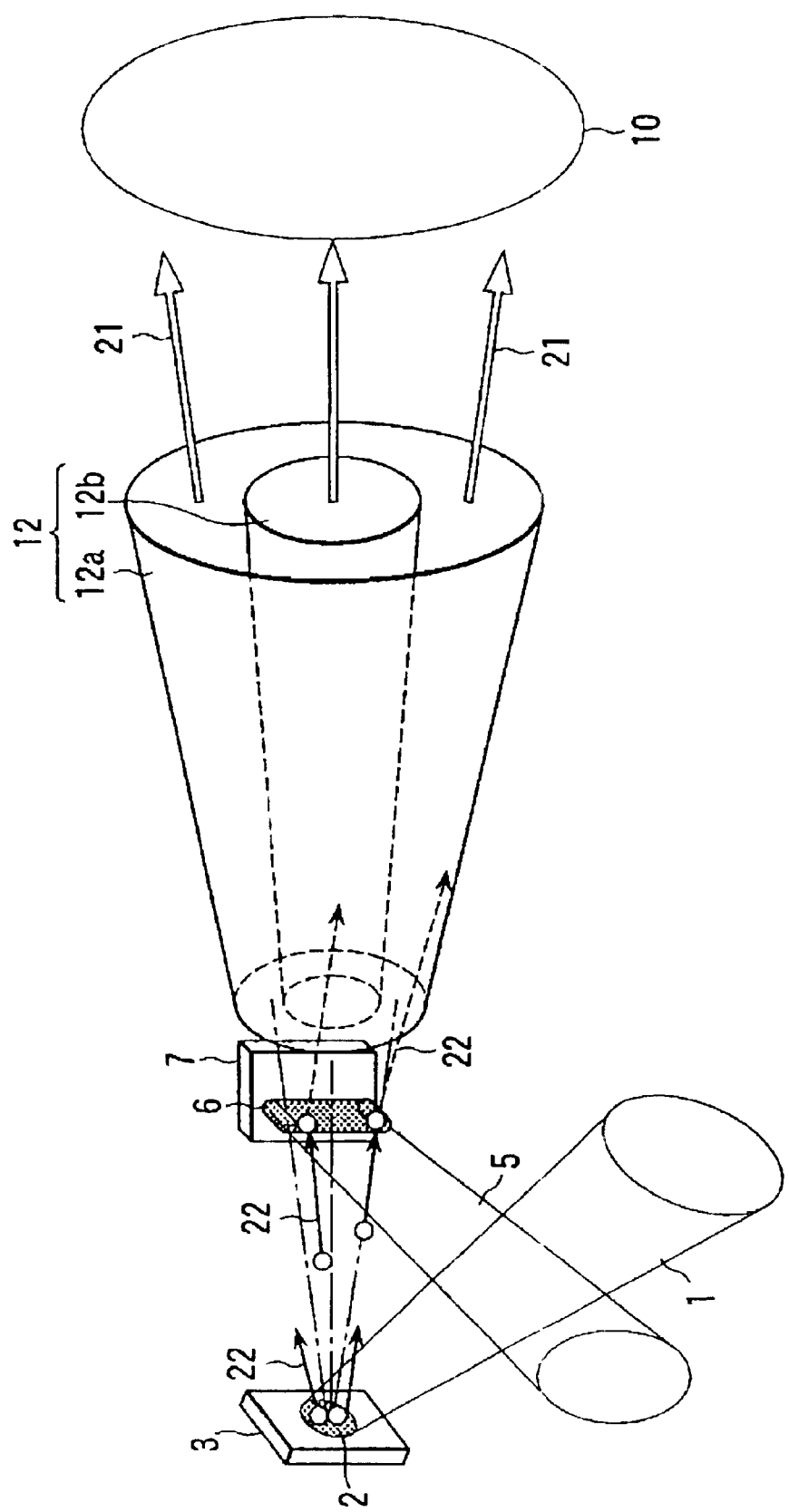
FIG. 5 is an explanatory diagram of still another embodiment of the method contemplated by this invention for the elimination of ion in the large solid angle area EUV light-radiating device.

Furthermore, in place of the bundle of plural cones shown in FIG. 4, a dual structure 12 shown in FIG. 5 can bring about the same effects, which comprises a large-diameter cone 12a and a small-diameter cone 12b fitted in the large-diameter cone 12a. It is noted that the same effect can be obtained in the case of triangular, tetragonal, or other similar shape pyramids in stead of cones.

While the dual structure 12 is as shown in FIG. 5, this is by no means limitative. A triple or more-fold structure can be used as occasion demands.

The method of irradiating the target 3 with the pulse laser 1 to produce the plasma EUV light source 2 and causing the high-energy ion 22 issuing in conjunction with the EUV light to be separated by the plasma 6 from the orbit of the EUV light to eliminate the high-energy ion is also applicable to the configuration shown in FIG. 4 or FIG. 5. Therefore, the same reference numerals as used in FIG. 3 are assigned to the components in FIG. 4 or FIG. 5 corresponding to those in FIG. 3, and the description thereof is omitted.

According to this invention, by causing the high-energy ion emitted from the plasma EUV light source to collide against another laser-produced plasma, it is made possible to realize a high-speed shutter and secure a completely flawless EUV light intensity. Further, by separating the orbit of scattered particles from the EUV light by virtue of the collision, it is made possible to eliminate low-energy ions and microparticles using a mechanical shutter in conjunction with the high-speed shutter and attain protracted exposure to the EUV light without suffering the specimen for the irradiation with the EUV light to incur even a minimal change of composition caused by the high-energy ion.

By further combining this invention with partitioning walls of such a construction as avoids decreasing the solid angle having the EUV light source at the apex thereof it is made possible even in the collection of ion in the large solid angle to effect the expected elimination of high-energy ion from the plasma EUV light source.

What is claimed is:

1. A method for the elimination of a high-energy ion in an EUV light-radiating device, which comprises irradiating a first target with a first exciting laser to produce a laser-produced plasma EUV light source and causing a high-energy ion generated simultaneously with EUV light to collide against plasma produced by irradiating a second target with a second laser to separate said high-energy ion from an orbit of said EUV light.

2. The method according to claim 1, wherein said plasma EUV light source is pinch plasma or discharge plasma entrapped in a capillary tube.

3. The method according to claim 1, which further comprises effecting passage of said EUV light and subsequently causing said high-energy ion entrained by said EUV light to collide against said plasma.

4. An apparatus for the elimination of a high-energy ion in an EUV light-radiating device, comprising means for irradiating a first target with a first exciting laser to produce a plasma EUV light source and induce emission of EUV light, means for irradiating a second target with a second laser to produce plasma, and means for effecting passage of said EUV light and subsequently causing said high-energy ion entrained by said EUV light to collide against said plasma to separate said high-energy ion from an orbit of said EUV light.

5. The apparatus according to claim 4, wherein said plasma is pinch plasma or discharge plasma entrapped in a capillary tube.

6. The apparatus according to claim 4, wherein said second target is formed of any one of elements Si, Ar, Zn, Ga, Kr, Mo, In, Sn, Xe, Pb and Hg, or a compound having any one of the elements as a principal component thereof.

7. The apparatus according to claim 4, wherein said first target is formed of any one of elements B, C, Al, Cu, Xe and Sn, or a compound having any one of the elements as a principal component thereof.

8. The apparatus according to claim 5, wherein said pinch or discharge plasma is formed of Xe, Sn or a Sn compound.

9. The apparatus according to claim 4, wherein said plasma is produced by condensing said laser in a form of discrete column on said second target.

10. The apparatus according to claim 4, wherein said plasma is produced in a planar shape by condensing said laser linearly on said second target.

11. The apparatus according to claim 4, wherein said second target is inclined at a predetermined angle to prevent an ion issuing from said plasma from entering an object for irradiation with said EUV light in a solid angle.

12. The apparatus according to claims 4, further comprising a plate interposed between said plasma and an object for irradiation with said EUV light so as to prevent an ion issuing from said plasma from entering said object in a solid angle.

13. The apparatus according to claim 4, further comprising partitioning walls disposed in front of an object for irradiation with said EUV light so that said high-energy ion collides initially against said plasma and subsequently against said partitioning walls and keeps from reaching said object.

14. The apparatus according to claim 13, wherein said partitioning walls are formed of a plurality of plates disposed at predetermined intervals.

15. The apparatus according to claim 13, wherein said partitioning walls are formed of a bundle of plural cones.

16. The apparatus according to claim 13, wherein each of said partitioning walls is formed of a large-diameter cone and a small-diameter cone accommodated in said large-diameter cone.

* * * * *